US006723618B2

(12) United States Patent
Meyer et al.

(10) Patent No.: US 6,723,618 B2
(45) Date of Patent: Apr. 20, 2004

(54) METHODS OF FORMING FIELD ISOLATION STRUCTURES

(75) Inventors: Russell Meyer, Boise, ID (US); Jeffrey W. Honeycutt, Boise, ID (US); Stephen R. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/206,602

(22) Filed: Jul. 26, 2002

(65) Prior Publication Data

US 2004/0016986 A1 Jan. 29, 2004

(51) Int. Cl.[7] ................ H01L 21/8238; H01L 21/8242; H01L 21/331; H01L 21/76
(52) U.S. Cl. .................. 438/429; 438/222; 438/226; 438/244; 438/245; 438/360; 438/413; 438/424; 438/442; 438/443; 438/445
(58) Field of Search ................ 438/222, 226, 438/244, 245, 360, 413, 424, 429, 442, 443, 445

(56) References Cited

U.S. PATENT DOCUMENTS

| 4,843,025 A | * | 6/1989 | Morita ................ 438/388 |
| 5,087,586 A | * | 2/1992 | Chan et al. .......... 438/429 |
| 5,236,863 A | * | 8/1993 | Iranmanesh .......... 438/429 |
| 5,557,135 A |   | 9/1996 | Hashimoto .......... 257/308 |
| 5,714,787 A |   | 2/1998 | Eguchi et al. ........ 257/394 |
| 5,744,386 A | * | 4/1998 | Kenney ................ 438/245 |
| 5,895,946 A | * | 4/1999 | Hamamoto et al. .. 257/302 |
| 5,926,721 A | * | 7/1999 | Hong et al. .......... 438/413 |
| 6,037,210 A | * | 3/2000 | Leas .................... 438/245 |
| 6,146,970 A | * | 11/2000 | Witek et al. ......... 438/424 |
| 6,180,493 B1 | * | 1/2001 | Chu .................... 438/437 |
| 6,274,919 B1 |   | 8/2001 | Wada ................... 257/508 |
| 6,306,723 B1 | * | 10/2001 | Chen et al. .......... 438/429 |
| 6,436,791 B1 | * | 8/2002 | Lin et al. ............. 438/424 |
| 6,555,891 B1 | * | 4/2003 | Furukawa et al. .... 257/505 |
| 2003/0129837 A1 | * | 7/2003 | Enders ................. 438/689 |

OTHER PUBLICATIONS

C. Mouli, *STI Scaling—Impact of Bias in Neighboring Cells on Access Device Characteristics*, http://cmouli.micron-.com:82/staff/cmouli/reports/STI–Scaling/sti–scaling.html, 8 pages (Sep. 27, 2001).
J. Sim et al., High–Performance Cell Transistor Design Using Metallic Shield Embedded Shallow Trench Isolation (MSE–STI) for Gbit . . . , 46 IEEE Transaction on Electron Devices No. 6, pp. 1212–1217 (Jun. 1999).

* cited by examiner

*Primary Examiner*—John F. Niebling
*Assistant Examiner*—Stanetta Isaac
(74) *Attorney, Agent, or Firm*—Wells St. John P.S.

(57) ABSTRACT

Field isolation structures and methods of forming field isolation structures are described. In one implementation, the method includes etching a trench within a monocrystalline silicon substrate. The trench has sidewalls and a base, with the base comprising monocrystalline silicon. A dielectric material is formed on the sidewalls of the trench. Epitaxial monocrystalline silicon is grown from the base of the trench and over at least a portion of the dielectric material. An insulating layer is formed over the epitaxial monocrystalline silicon. According to one implementation, the invention includes a field isolation structure formed within a monocrystalline silicon comprising substrate. The field isolation structure includes a trench having sidewalls. A dielectric material is received on the sidewalls within the trench. Monocrystalline silicon is received within the trench between the dielectric material of the sidewalls. An insulating layer is received over the monocrystalline silicon within the trench. Additional implementations are contemplated.

19 Claims, 3 Drawing Sheets

METHODS OF FORMING FIELD ISOLATION STRUCTURES

TECHNICAL FIELD

This invention relates to field isolation structures and to methods of forming field isolation structures.

BACKGROUND OF THE INVENTION

In semiconductor wafer fabrication, isolation of adjacent devices has often been accomplished by forming thick oxide regions between the adjacent devices using a local oxidation of silicon method (often referred to as LOCOS) or by forming trench isolation regions between the adjacent devices. As critical dimensions get smaller and smaller in ever increasing density geometries, the width of the isolation regions formed between adjacent devices has decreased. Accordingly, the isolation effect provided by such isolation regions has also decreased. At some point, the isolation is decreased enough that the potential of source-drain regions of adjacent devices, which are electrically isolated by such isolation regions, begins to be adversely effected. For example, as the degree of isolation decreases, the threshold/turn-on voltages of adjacent devices may be effected, adversely impacting the operation of such devices.

Methods exist wherein conductively doped polysilicon is deposited within isolation trenches as isolation material. In one such process, a trench is formed within a bulk substrate, and then the sidewalls and base of the trench are thermally oxidized. After the oxidation has been completed, the base of the trench is etched, and then conductively doped polysilicon is deposited within the trench as isolation material. In another such process, the base of the trench is not etched, and the conductively doped polysilicon is deposited over the oxide which covers the base of the trench.

Although such methods of forming trench isolation regions are useful, such methods also have shortcomings. For example, when the conductively doped polysilicon is provided by deposition, the processing generally requires an additional step wherein excess polysilicon which has been formed outside the trench is removed. Additionally, when conductively doped polysilicon is provided within a trench to form an isolation region between an n-type region and a p-type region, due to non-ideal PN junction formation, current leakage tends to occur between the n-type region and the p-type region.

The present invention was principally motivated in overcoming the above identified issues. However, the invention is in no way so limited, and is only limited by the accompanying claims as literally worded and appropriately interpreted in accordance with the Doctrine of Equivalents.

SUMMARY OF THE INVENTION

Field isolation structures and methods of forming field isolation structures are described. In one implementation, a method includes etching a trench within a monocrystalline silicon substrate. The trench has sidewalls and a base, with the base comprising monocrystalline silicon. A dielectric material is formed on the sidewalls of the trench. Epitaxial monocrystalline silicon is grown from the base of the trench and over at least a portion of the dielectric, material. An insulating layer is formed over the epitaxial monocrystalline silicon.

According to one implementation, the invention includes a field isolation structure formed within a semiconductor substrate. The field isolation structure includes a monocrystalline silicon comprising substrate. A trench having sidewalls is formed within the monocrystalline silicon comprising substrate. A dielectric material is received on the sidewalls within the trench. Monocrystalline silicon is received within the trench between the dielectric material of the sidewalls. An insulating layer is received over the monocrystalline silicon within the trench.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
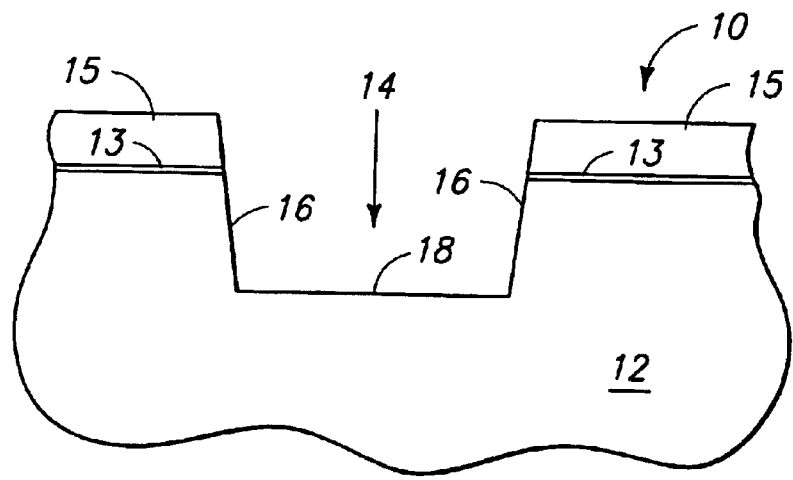
FIG. 1 is a diagrammatic sectional view of a wafer fragment at one processing step in accordance with one aspect of the invention.

Preferred embodiment field isolation structures and methods of forming field isolation structures are described initially with reference to FIGS. 1–5. FIG. 1 depicts a semiconductor wafer fragment 10 comprising a bulk monocrystalline silicon substrate 12. In the context of this document, the term "semiconductive substrate" or "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other material). The term "substrate" refers to any supporting structure, including, but not limited to, the semiconductive substrates described above. Also, in the context of this document, the term "layer" refers to both the singular and plural, unless otherwise indicated. A pad oxide layer 13 and a silicon nitride layer 15 are received over the substrate 10, and have been patterned for forming a trench. In the depicted example, the method includes etching a trench 14 within the monocrystalline silicon substrate 12. Any existing or yet-to-be-developed method of etching, with or without masking, is contemplated. An exemplary depth is 3000 Angstroms. The trench 14 has sidewalls 16 and a base 18. The base 18 comprises monocrystalline silicon. In one preferred embodiment, the base 18 consists essentially of monocrystalline silicon.

Figure 2:
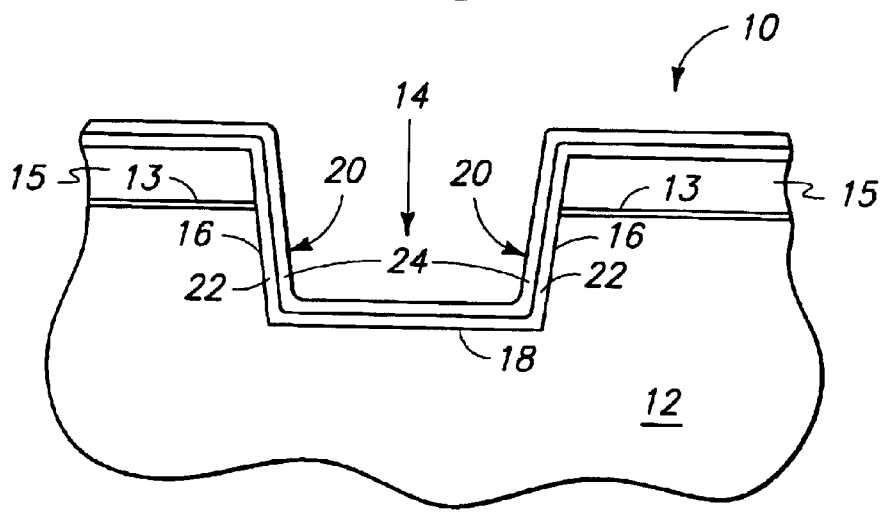
FIG. 2 is a view of the FIG. 1 wafer at a processing step subsequent to that shown by FIG. 1.

Referring to FIG. 2, a dielectric material 20 is formed on the sidewalls 16 of the trench 14. Such might include single or multiple materials or layers, with two such layers 22 and 24 being shown. Although a variety of materials may be used to form the dielectric material 20, a preferred method of forming dielectric material 20 is described below. Specifically, after the trench 14 is formed, the sidewalls 16 and the base 18 of the trench 14 are thermally oxidized to form a silicon dioxide comprising layer 22 thereover. Any suitable oxidizing conditions are contemplated, for example using a temperature of about 650° C. to about 1,100° C., atmospheric pressure, and an atmosphere comprising $H_2O$. By way of example only, an exemplary thickness range for layer 22 is from about 75 Angstroms to about 300 Angstroms. A nitride comprising layer 24 is deposited over the silicon dioxide comprising layer 22. By way of example only, an exemplary thickness range for layer 24 is from about 40 Angstroms to about 100 Angstroms. Of course, either of these layers can be used alone to form the dielectric material layer 20, or other appropriate material(s) can be used in their place. Accordingly, in one embodiment the dielectric material comprises silicon dioxide. In one embodiment the dielectric material comprises a nitride. In one embodiment, the dielectric material comprises silicon nitride, and for example consisting essentially of silicon nitride.

Figure 3:
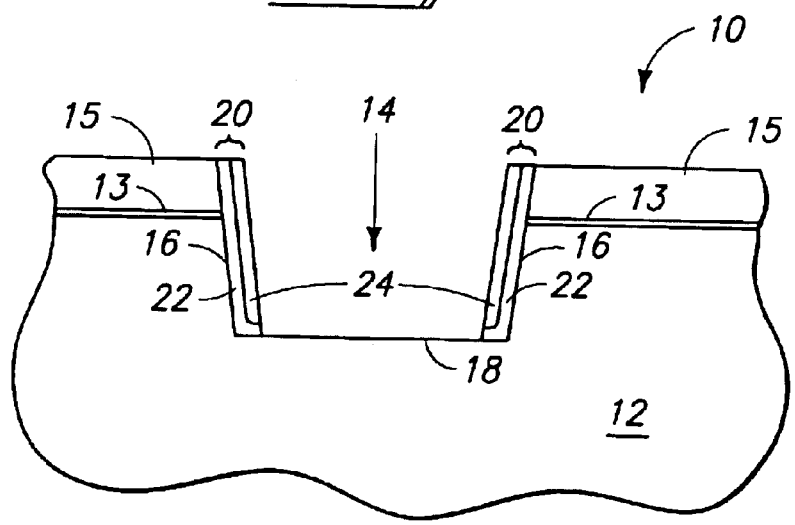
FIG. 3 is a view of the FIG. 2 wafer at a processing step subsequent to that shown by FIG. 2.

Referring to FIG. 3, in a preferred method, the silicon dioxide comprising layer 22 and the nitride comprising layer 24 are anisotropically etched from the base 18 of the trench 14 to expose the monocrystalline silicon substrate 12 thereunder. The base 18 of the trench 14 is then preferably cleaned to remove any native oxide, and to provide a clean surface for the growth of epitaxial monocrystalline silicon (as described below). A preferred technique for cleaning the base of the trench is to perform an HF dip at 21° C. to remove any native oxide. During the HF dip, the nitride comprising layer 24 on the trench sidewalls 16 may help to prevent etching of the silicon dioxide comprising layer 22 on the trench sidewalls 16.

Figure 4:
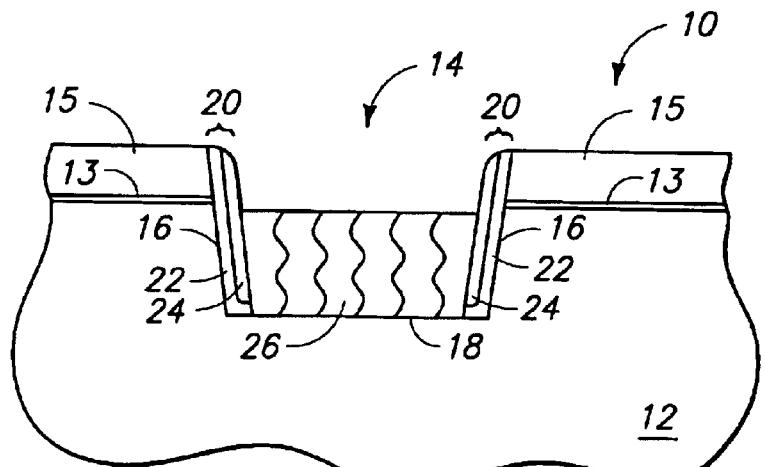
FIG. 4 is a view of the FIG. 3 wafer at a processing step subsequent to that shown by FIG. 3.

Referring to FIG. 4, epitaxial monocrystalline silicon 26 is grown from the base 18 of the trench 14 and over at least a portion of the dielectric material 20 to less than completely fill the trench 14. Any existing or yet-to-be-developed method is contemplated. By way of example only, one method includes growing epitaxial monocrystalline silicon 26 from the base 18 of the trench 14 and over at least a portion of the nitride comprising layer 24 to less than completely fill the trench 14. Any suitable conditions for growth of the epitaxial monocrystalline silicon 26 are contemplated, for example using a temperature of about 700° C. to about 1000° C., a pressure of about 5 Torr to about 30 Torr, and precursor gases including $SiH_2Cl_2$, $HCl$ and $H_2$. Alternatively, and by way of example only, $SiCl_4$ or $Si_2H_6$ may be used as precursor gases.

Figure 5:
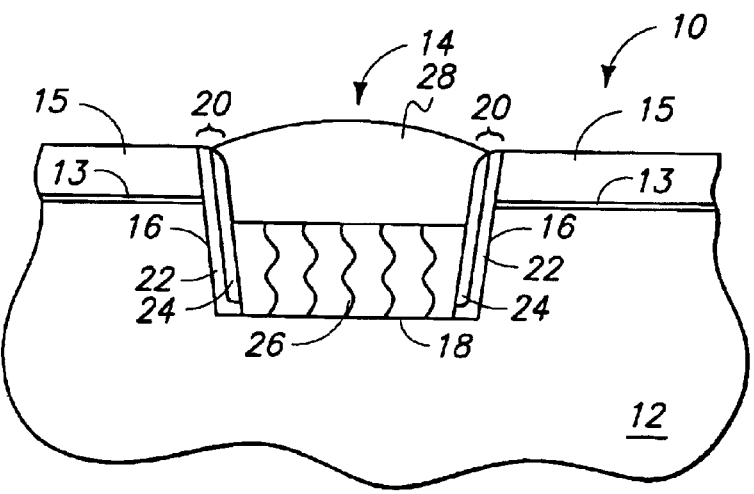
FIG. 5 is a view of the FIG. 4 wafer at a processing step subsequent to that shown by FIG. 4.

Referring to FIG. 5, an insulating layer 28 is formed over the epitaxial monocrystalline silicon 26. In a preferred embodiment, the insulating layer 28 is formed by thermally oxidizing the epitaxial monocrystalline silicon 26 to form a silicon dioxide comprising material on the epitaxial monocrystalline silicon 26 and within the trench 14. In the illustrated embodiment, the insulating layer 28 is formed effective to fill the trench 14. An example process for forming material 28 includes thermal oxidation of the epitaxial monocrystalline silicon 26. An example thickness for material 28 is from about 500 Angstroms to about 1,500 Angstroms.

Although preferred methods form the insulating layer 28 by thermally oxidizing the epitaxial monocrystalline silicon 26, any suitable process may be used to form the insulating layer 28 over (preferably on as shown) the epitaxial monocrystalline silicon 26. One alternative is to deposit (i.e., by CVD; including high density plasma, for example) an oxide or other insulator over the epitaxial monocrystalline silicon 26. However, thermal oxidation of the epitaxial monocrystalline silicon 26 is preferred as shown, with the nitride comprising layers 15 and 24 acting as a mask while the thermal oxidation is occurring, so that the insulating layer 28 is selectively formed on the epitaxial monocrystalline silicon 26. Accordingly, no subsequent removal of deposited material is typically employed when thermal oxidation of the epitaxial monocrystalline silicon 26 is used to form the insulating layer 28. Alternatively, if insulating layer 28 is deposited, subsequent removal of the deposited material from other areas of the semiconductor wafer 10 will most likely occur. An exemplary preferred thickness for the insulating layer 28 is from about 500 Angstroms to about 1,500 Angstroms.

Figure 6:
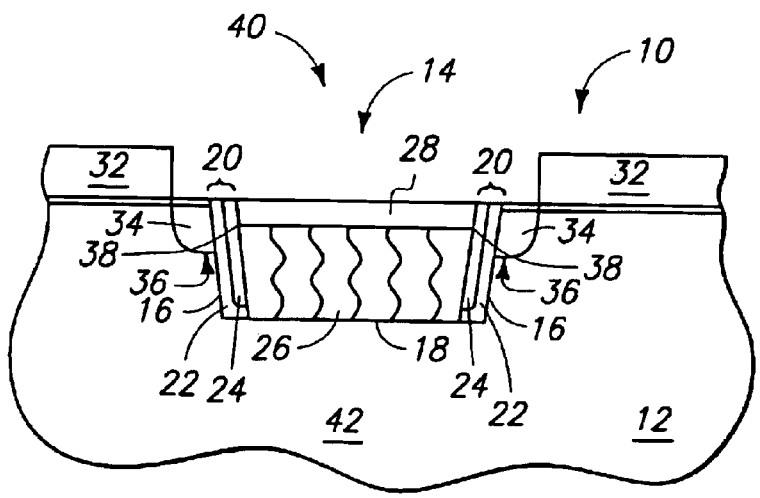
FIG. 6 is a view of the FIG. 5 wafer at a processing step subsequent to that shown by FIG. 5.

FIG. 6 shows layer 13 and 15 as having been removed, portions of materials 28, 22 and 24 removed, and a resultant field isolation structure 40. Gates 32 are diagrammatically shown as being formed relative to opposing sides of the trench 14. Doped source/drain regions 34 have been formed within the monocrystalline silicon substrate 12 adjacent to opposing sides of the trench 14 and adjacent gates 32. The source/drain regions 34 have junction bases 36 at the sidewalls 16 of the trench 14. In a preferred embodiment, the epitaxial monocrystalline silicon 26 is provided from the base 18 of the trench 14 to a point 38 elevationally above the respective junction bases 36. Desired background or other well implants can of course be conducted before or after forming gates 32.

Ultimately preferably, epitaxial monocrystalline silicon 26 is doped to the same background type and concentration as that of underlying substrate 12. This could occur at the same time as or separately from the doping of substrate 12. Further if desired, one or more additional implants into material 26 could be conducted for improved isolation without necessarily impacting the junctions which are being isolated.

Figure 7:
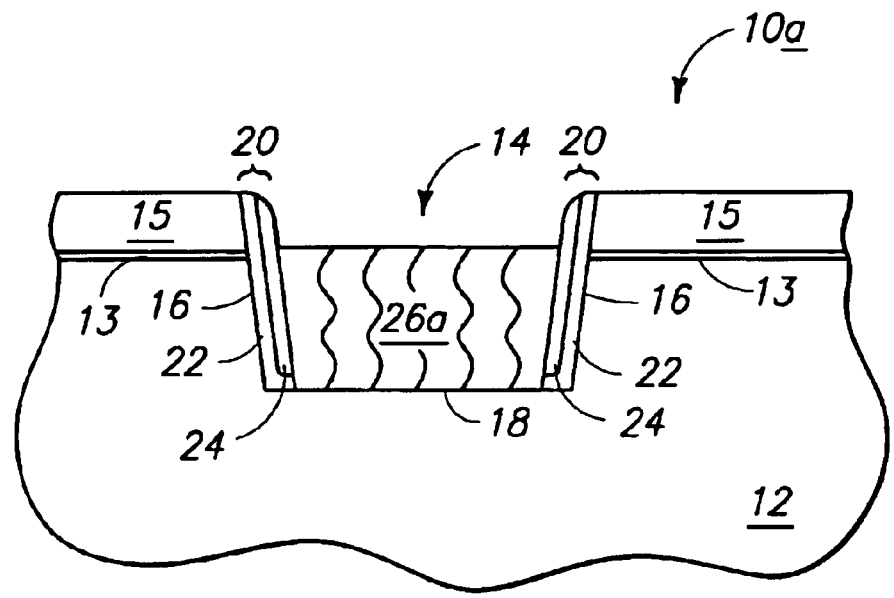
FIG. 7 is a diagrammatic sectional view of a wafer fragment at one processing step in accordance with one aspect of the invention.
Figure 8:
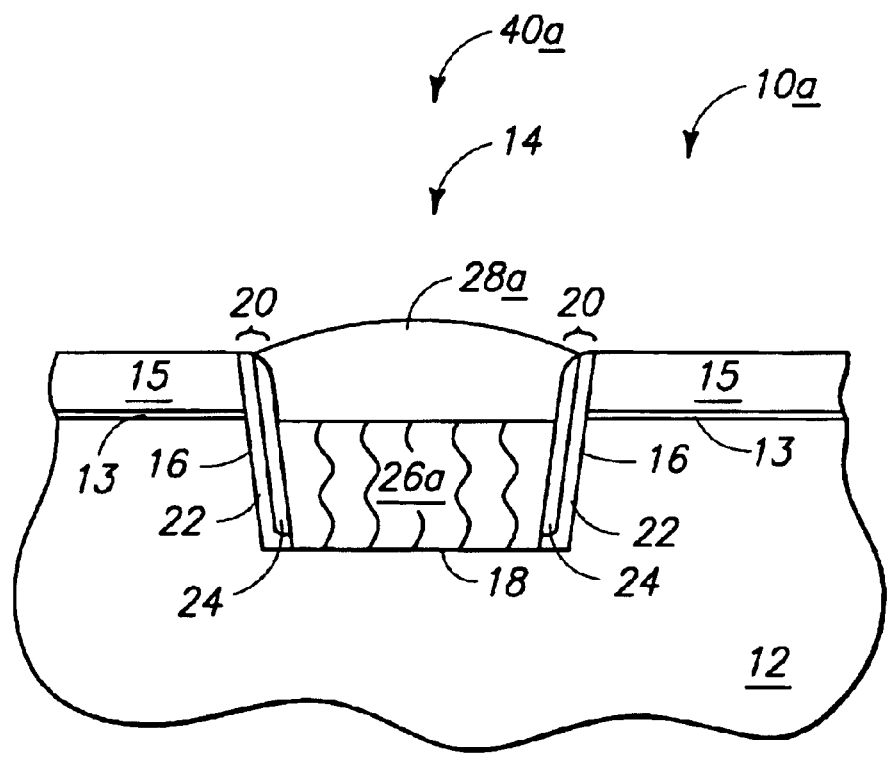
FIG. 8 is a view of the FIG. 7 wafer at a processing step subsequent to that shown by FIG. 7.

But one exemplary alternate embodiment is described with reference to FIGS. 7 and 8. Like numerals from the first described embodiment are utilized where appropriate, with differences being indicated by the suffix "a" or with different numerals. Referring to FIG. 7, such differs from the first described embodiment in that here, epitaxial monocrystalline silicon 26a is grown from the base 18 of the trench 14 and over at least a portion of the dielectric material 20 to completely fill the trench 14. As shown in FIG. 8, the epitaxial monocrystalline silicon 26a is then oxidized to form insulating layer 28a over the epitaxial monocrystalline silicon 26a.

The invention also contemplates a field isolation structure independent of the method and for example, and by way of example only, as shown in FIG. 6. FIG. 6 depicts a field isolation structure 40 formed within a monocrystaltine silicon comprising substrate 12. The field isolation structure includes a trench 14 having sidewalls 16 which have been formed within the monocrystalline silicon comprising substrate 12: A dielectric material 20 is received on the sidewalls 16 within the trench 14. Monocrystalline silicon 26 is received within the trench 14 between the dielectric material 20 of the sidewalls 16. An insulating layer 28 is received over the monocrystalline silicon 26 within the trench 14. As shown in FIG. 6, the monocrystalline silicon 26 received within the trench 14 between the dielectric material 20 of the sidewalls 16 less than completely fills the trench 14. The monocrystalline silicon 26 received within the trench 14 is effective to fill the trench 14 to a point 38 elevationally above the respective junction bases 36. The insulating layer 28 formed over the monocrystalline silicon 26 may comprise for example, silicon dioxide.

Still referring to FIG. 6, such also depicts a field isolation structure 40 formed within a monocrystalline silicon comprising substrate 12 having a region 42 of a first conductivity type (i.e., p-doped or n-doped). The field isolation structure 40 includes a trench 14 having sidewalls 16 formed within the region 42 of the first conductivity type. A silicon dioxide comprising layer 22 is received over the sidewalls 16 within the trench. A nitride comprising layer 24 is received over the silicon dioxide comprising layer 22 within the trench 14. Monocrystalline silicon 26 of the first conductivity type is received on the monocrystalline silicon comprising substrate 12 within the trench 14, and less than completely fills the trench. An insulating layer 28 is received over the monocrystalline silicon 26 within the trench 14.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the Doctrine of Equivalents.

What is claimed is:

1. A method of forming a field isolation structure, comprising:
    forming a pad oxide layer and a masking layer over a monocrystalline silicon comprising substrate, the monocrystalline silicon comprising substrate having an outermost monocrystalline silicon comprising surface on which the pad oxide is received;
    etching a trench within the monocrystalline silicon comprising substrate through the masking layer and the pad oxide layer, the trench having sidewalls and a base, the base comprising monocrystalline silicon;
    thermally oxidizing the sidewalls and the base of the trench to form a silicon dioxide comprising layer thereover;
    depositing a nitride comprising layer over the silicon dioxide comprising layer within the trench;
    anisotropically etching the silicon dioxide comprising layer and the nitride comprising layer from the base of the trench to expose monocrystalline silicon material of the substrate;
    growing epitaxial monocrystalline silicon from the base of the trench and over at least a portion of the nitride comprising layer effective to overfill the trench to above the outermost monocrystalline silicon comprising surface, the epitaxial monocrystalline silicon having an outermost surface which is received elevationally outward of the outermost monocrystalline silicon comprising surface on which the pad oxide layer is received; and
    thermally oxidizing the epitaxial monocrystalline silicon effective to form a silicon dioxide comprising material on the epitaxial monocrystalline silicon within the trench, the thermally oxidizing of the epitaxial monocrystalline silicon being effective to move its outermost surface elevationally inward to be received inwardly of the outermost monocrystalline silicon comprising surface on which the pad oxide layer is received.

2. The method of claim 1, wherein the base consists essentially of monocrystalline silicon.

3. The method of claim 1, wherein the nitride comprising layer consists essentially of silicon nitride.

4. The method of claim 1, and further comprising forming doped source/drain regions within the monocrystalline silicon substrate, the doped source/drain regions having a junction base at the sidewalls of the trench, and wherein the growing comprises growing epitaxial monocrystalline silicon to a point elevationally above the respective junction bases.

5. The method of claim 1 comprising cleaning the base of the trench prior to the growing.

6. The method of claim 1 comprising cleaning the base of the trench with HF prior to the growing.

7. The method of claim 1 wherein the pad oxide layer has an outermost surface, the growing being effective to form the epitaxial monocrystalline silicon outermost surface to be received elevationally outward of the pad oxide layer outermost surface prior to thermally oxidizing the epitaxial monocrystalline silicon.

8. The method of claim 1 wherein the masking layer has an outermost surface, the growing being effective to form the epitaxial monocrystalline silicon outermost surface to be received elevationally inward of the masking layer outermost surface prior to thermally oxidizing the epitaxial monocrystalline silicon.

9. The method of claim 1 wherein,
    the pad oxide layer has an outermost surface, the growing being effective to form the epitaxial monocrystalline silicon outermost surface to be received elevationally outward of the pad oxide layer outermost surface prior to thermally oxidizing the epitaxial monocrystalline silicon; and
    the masking layer has an outermost surface, the growing being effective to form the epitaxial monocrystalline silicon outermost surface to be received elevationally inward of the masking layer outermost surface prior to thermally oxidizing the epitaxial monocrystalline silicon.

10. The method of claim 1 wherein the masking layer has an outermost surface, the thermally oxidizing the epitaxial monocrystalline silicon forming an outermost surface of the silicon dioxide comprising material to be received elevationally outward of the masking layer outermost surface.

11. The method of claim 7 wherein the masking layer has an outermost surface, the thermally oxidizing the epitaxial monocrystalline silicon forming an outermost surface of the silicon dioxide comprising material to be received elevationally outward of the masking layer outermost surface.

12. The method of claim 8 wherein the thermally oxidizing the epitaxial monocrystalline silicon forms an outermost surface of the silicon dioxide comprising material to be received elevationally outward of the masking layer outermost surface.

13. The method of claim 9 wherein the thermally oxidizing the epitaxial monocrystalline silicon forms an outermost surface of the silicon dioxide comprising material to be received elevationally outward of the masking layer outermost surface.

14. The method of claim 1 wherein monocrystalline silicon material of the monocrystalline silicon comprising substrate is background doped, and further comprising doping the epitaxially grown monocrystalline silicon with the same type dopant as that of the monocrystalline silicon material of the monocrystalline silicon comprising substrate.

15. The method of claim 14 wherein the doping of the epitaxially grown monocrystalline silicon occurs separately of the background doping of the monocrystalline silicon material of the monocrystalline silicon comprising substrate.

16. The method of claim 14 wherein the doping of the epitaxially grown monocrystalline silicon and the background doping of the monocrystalline silicon material of the monocrystalline silicon comprising substrate occur at the same time.

17. The method of claim 1 wherein monocrystalline silicon material of the monocrystalline silicon comprising substrate is background doped to a concentration, and further comprising doping the epitaxially grown monocrystalline silicon with the same type dopant as that of the monocrystalline silicon material of the monocrystalline silicon comprising substrate and to the same concentration.

18. The method of claim 17 wherein the doping of the epitaxially grown monocrystalline silicon occurs separately of the background doping of the monocrystalline silicon material of the monocrystalline silicon comprising substrate.

19. The method of claim 17 wherein the doping of the epitaxially grown monocrystalline silicon and the background doping of the monocrystalline silicon material of the monocrystalline silicon comprising substrate occur at the same time.

\* \* \* \* \*

UNITED STATES PATENT AND TRADEMARK OFFICE
CERTIFICATE OF CORRECTION

PATENT NO. : 6,723,618 B2
DATED : April 20, 2004
INVENTOR(S) : Meyer et al.

It is certified that error appears in the above-identified patent and that said Letters Patent is hereby corrected as shown below:

Column 1,
Line 63, replace "and over at least a portion of the dielectric, material." with -- and over at least a portion of the dielectric material. --

Column 4,
Lines 60 and 61, replace "comprising substrate 12: A dielectric material 20 is received on the" with -- comprising substrate 12. A dielectric material 20 is received on the --

Signed and Sealed this

Thirtieth Day of November, 2004

JON W. DUDAS
*Director of the United States Patent and Trademark Office*